(12) United States Patent
Chujo et al.

(10) Patent No.: US 9,822,226 B2
(45) Date of Patent: Nov. 21, 2017

(54) DRY FILM AND PRINTED WIRING BOARD

(71) Applicant: TAIYO INK MFG. CO., LTD., Hiki-gun (JP)

(72) Inventors: Takayuki Chujo, Hiki-gun (JP); Arata Endo, Hiki-gun (JP)

(73) Assignee: TAIYO INK MFG. CO., LTD., Hiki-gun (JP)

( * ) Notice: Subject to any disclaimer, the term of this patent is extended or adjusted under 35 U.S.C. 154(b) by 0 days.

(21) Appl. No.: 14/934,700

(22) Filed: Nov. 6, 2015

(65) Prior Publication Data

US 2016/0060408 A1  Mar. 3, 2016

Related U.S. Application Data

(63) Continuation-in-part of application No. PCT/JP2014/067209, filed on Jun. 27, 2014.

(30) Foreign Application Priority Data

Jun. 28, 2013 (JP) .................. 2013-137184

(51) Int. Cl.
| | |
|---|---|
| *B32B 3/00* | (2006.01) |
| *C08J 5/18* | (2006.01) |
| *H05K 1/03* | (2006.01) |
| *H05K 3/46* | (2006.01) |
| *H05K 1/02* | (2006.01) |
| *H05K 3/42* | (2006.01) |

(52) U.S. Cl.
CPC ............ *C08J 5/18* (2013.01); *H05K 1/0271* (2013.01); *H05K 1/0373* (2013.01); *H05K 3/4676* (2013.01); *C08J 2363/00* (2013.01); *H05K 3/429* (2013.01); *H05K 2203/0537* (2013.01); *H05K 2203/0783* (2013.01)

(58) Field of Classification Search
CPC .. H01K 1/0271; H01K 1/0373; H01K 3/4676; H01K 3/429; H01K 2203/0783; C08J 5/18

See application file for complete search history.

(56) References Cited

U.S. PATENT DOCUMENTS

| | | | |
|---|---|---|---|
| 2001/0000518 | A1 | 4/2001 | Sekimoto et al. |
| 2007/0148442 | A1 | 6/2007 | Shibayama et al. |
| 2011/0007490 | A1 | 1/2011 | Onishi |
| 2011/0278053 | A1 | 11/2011 | Hayashi et al. |
| 2013/0122420 | A1 | 5/2013 | Kato |

FOREIGN PATENT DOCUMENTS

| | | |
|---|---|---|
| JP | 7-304931 A | 11/1995 |
| JP | 7-304933 A | 11/1995 |
| JP | 2005-082742 A | 3/2005 |
| JP | 2010-001403 A | 1/2010 |
| JP | 2011-126963 A | 6/2011 |
| JP | 2013-189577 A | 9/2013 |
| JP | 2014-047318 A | 3/2014 |
| TW | 201302831 A1 | 1/2013 |
| WO | WO 2005/056683 A1 | 6/2005 |
| WO | WO 2009/038177 A1 | 3/2009 |
| WO | WO 2009/116609 A1 | 9/2009 |
| WO | WO 2010/038644 A1 | 4/2010 |
| WO | WO 2012/023164 A1 | 2/2012 |

OTHER PUBLICATIONS

International Search Report dated Aug. 19, 2014, in PCT Application No. PCT/JP2014/067209 (4 pages).
Office Action dated Jul. 25, 2017 in Taiwan application No. 103122492, filed Jun. 30, 2014 (with partial English translation).

*Primary Examiner* — Elizabeth Mulvaney
(74) *Attorney, Agent, or Firm* — Oblon, McClelland, Maier & Neustadt, L.L.P.

(57) ABSTRACT

An object of the present invention is to provide: a dry film comprising a resin layer which has excellent detachability from a carrier film and in which cracking and powdering are inhibited; and a printed wiring board comprising a cured article obtained by curing the dry film. The dry film comprises a resin layer containing a thermosetting resin component, a filler and at least two solvents, wherein the at least two solvents both have a boiling point of 100° C. or higher and the boiling points of the at least two solvents are different by not less than 5° C.

19 Claims, 2 Drawing Sheets

DRY FILM AND PRINTED WIRING BOARD

CROSS-REFERENCE TO RELATED APPLICATIONS

This application is a continuation-in-part of PCT Application No. PCT/JP2014/067209, which claims priority to Japanese Patent Application No. 2013-137184, filed Jun. 28, 2013. The contents of these applications are incorporated herein by reference in their entireties.

TECHNICAL FIELD

The present invention relates to a dry film and a printed wiring board. More particularly, the present invention relates to a dry film comprising a resin layer which has excellent detachability from a carrier film and in which cracking and powdering are inhibited; and a printed wiring board comprising a cured article obtained by curing the dry film.

BACKGROUND ART

In recent years, as a method of producing a multilayer printed wiring board, a production technique using a build-up method in which resin insulating layers and conductor layers are alternately stacked on a conductor layer of an inner-layer circuit board has been drawing attention. For example, there have been proposed methods of producing a multilayer printed wiring board in which, after coating and heat-curing an epoxy resin composition on an inner-layer circuit board having a circuit formed thereon, the resulting surface is treated with a roughening agent to form an irregularly roughened surface and a conductor layer is subsequently formed by plating (see Patent Documents 1 and 2). Further, there has also been proposed a method of producing a multilayer printed wiring board in which an adhesive sheet of an epoxy resin composition is laminated and heat-cured on an inner-layer circuit board having a circuit formed thereon, the resulting surface is treated with a roughening agent to form an irregularly roughened surface and a conductor layer is subsequently formed by plating (see Patent Document 3).

Figure 1:
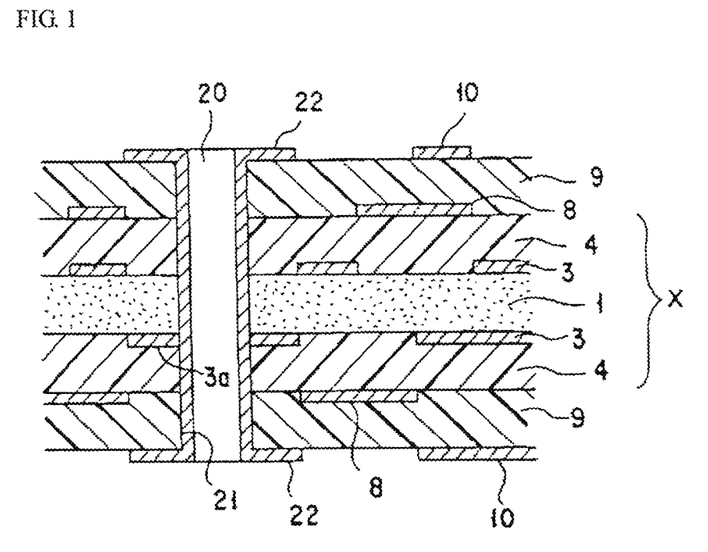
FIG. 1 is a partial cross-sectional view showing a schematic constitution of a multilayer printed wiring board produced by a conventional build-up method.

Describing one example of a method of forming a layered structure of a multilayer printed wiring board by a conventional build-up method while referring to FIG. 1, first, an outer conductor pattern 8 is formed on both sides of a laminated substrate X comprising an inner conductor pattern 3 and a resin insulating layer 4 that are formed on both sides of an insulating substrate 1 in advance, and a resin insulating layer 9 is then formed on each outer conductor pattern 8 by arranging an insulating resin composition such as an epoxy resin composition thereon by coating or the like and subsequently heat-curing the resin composition. Next, after appropriately forming a through-hole 21 and the like, a conductor layer is formed on the surface of each resin insulating layer 9 by electroless plating or the like and a prescribed circuit pattern is formed on the conductor layer in accordance with a conventional method, thereby an outermost conductor pattern 10 can be formed.

In a multilayer printed wiring boards, as a method of forming a resin insulating layer between layers (hereinafter, referred to as "interlayer insulating layer"), as described in Patent Document 3, a method in which a resin insulating layer is formed by laminating and then heat-curing a dry film that comprises a resin layer obtained by coating and drying a thermosetting resin composition such as an epoxy resin composition on a film is employed.

RELATED ART DOCUMENTS

Patent Documents

[Patent Document 1] Japanese Unexamined Patent Application Publication No. H7-304931 (Claims)
[Patent Document 2] Japanese Unexamined Patent Application Publication No. H7-304933 (Claims)
[Patent Document 3] Japanese Unexamined Patent Application Publication No. 2010-1403 (Claims)

SUMMARY OF THE INVENTION

Problems to be Solved by the Invention

As a heat-curable component incorporated in such a dry film, a liquid epoxy resin is used (for example, Patent Document 3). When a liquid epoxy resin is incorporated, the dry film shows excellent adhesion and cracking or powdering thereof does not occur. However, incorporation of a liquid epoxy resin has a problem in that it makes the resin layer adhere to a carrier film, causing the resin layer to be partially or entirely detached when the carrier film is peeled from the resin layer.

Therefore, an object of the present invention is to provide: a dry film comprising a resin layer which has excellent detachability from a carrier film and in which cracking and powdering are inhibited; and a printed wiring board comprising a cured article obtained by curing the dry film.

Means for Solving the Problems

In view of the above, the present inventors intensively studied to discover that the above-described problem can be solved by incorporating two solvents having different boiling points that are 100° C. or higher, thereby completing the present invention.

That is, the dry film of the present invention is a dry film comprising a resin layer containing a thermosetting resin component, a filler and at least two solvents, wherein the at least two solvents both have a boiling point of 100° C. or higher and the boiling points of the at least two solvents are different by not less than 5° C.

In the dry film of the present invention, it is preferred that the at least two solvents be at least two selected from the group consisting of N,N-dimethylformamide, toluene, cyclohexanone and aromatic hydrocarbons having 8 or more carbon atoms.

In the dry film of the present invention, it is preferred that the content of the filler be 30 to 80% by weight based on the total amount of the dry film excluding the solvents.

It is preferred that the dry film of the present invention comprise an epoxy compound as the thermosetting resin component and further a curing agent.

It is preferred that the dry film of the present invention be used for the production of a printed wiring board.

The printed wiring board of the present invention is characterized by comprising a cured article obtained by curing the resin layer of the dry film.

Effects of the Invention

According to the present invention, a dry film comprising a resin layer which has excellent detachability from a carrier film and in which cracking and powdering are inhibited as well as a printed wiring board comprising a cured article obtained by curing the dry film can be provided.

DETAILED DESCRIPTION OF THE INVENTION

Mode for Carrying Out the Invention

The dry film of the present invention is a dry film comprising a resin layer containing a thermosetting resin component, a filler and at least two solvents, wherein the at least two solvents both have a boiling point of 100° C. or higher and the boiling points of the at least two solvents are different by not less than 5° C. The difference between the boiling points is, for example, 5° C. to 130° C.

When only those solvents having a boiling point of lower than 100° C. are used, the resulting resin layer of the dry film is excessively dried, so that the flexibility is impaired and cracking and/or powdering occur.

Meanwhile, when only one solvent having a boiling point of 100° C. or higher is used or when two solvents whose boiling points are different by less than 5° C. are used, since an excessive amount of the solvent(s) remains to be present even after drying, the resin layer is also detached during removal of the carrier film, resulting in poor detachability. In addition, air bubbles are more likely to be generated, making it difficult to form a flat resin layer. Further, when the resin layer is dried at a high temperature in order to reduce the residual solvent(s), the resin layer is excessively heat-cured even in the drying step.

However, by incorporating two solvents both having a boiling point of 100° C. or higher with a different between the boiling points of not less than 5° C., a dry film comprising a resin layer which has excellent detachability from a carrier film and in which cracking and powdering are inhibited can be obtained. The components of the resin layer of the dry film of the present invention will now be described.

[Thermosetting Resin Component]

The resin layer of the dry film of the present invention contains a thermosetting resin component. The thermosetting resin component is a resin having a functional group(s) capable of undergoing heat-curing reaction when heated. The thermosetting resin component is not particularly restricted and, for example, an epoxy compound, a polyfunctional oxetane compound or a compound having two or more thioether groups in the molecule, namely an episulfide resin, can be used.

The epoxy compound is an epoxy group-containing compound, and any known such compound can be used. Examples thereof include bifunctional epoxy compounds having two epoxy groups in the molecule; and polyfunctional epoxy compounds having a plurality of epoxy groups in the molecule. The epoxy compound may also be a hydrogenated bifunctional epoxy compound.

Examples of the epoxy compound that can be used include bisphenol A-type epoxy resins, bisphenol F-type epoxy resins, hydrogenated bisphenol A-type epoxy resins, brominated bisphenol A-type epoxy resins, bisphenol S-type epoxy resins, phenol novolac-type epoxy resins, cresol novolac-type epoxy resins, bisphenol A novolac-type epoxy resins, biphenyl-type epoxy resins, naphthol-type epoxy resins, naphthalene-type epoxy resins, dicyclopentadiene-type epoxy resins, triphenylmethane-type epoxy resins, alicyclic epoxy resins, aliphatic chain epoxy resins, phosphorus-containing epoxy resins, anthracene-type epoxy resins, norbornene-type epoxy resins, adamantane-type epoxy resins, fluorene-type epoxy resins, aminophenol-type epoxy resins, aminocresol-type epoxy resins and alkylphenol-type epoxy resins. These epoxy resin may be used individually, or two or more thereof may be used in combination.

The epoxy compound may be any of solid epoxy resins, semi-solid epoxy resins and liquid epoxy resins. In the present specification, the term "solid epoxy resin" refers to an epoxy resin that is solid at 40° C.; the term "semi-solid epoxy resin" refers to an epoxy resin that is solid at 20° C. but liquid at 40° C.; and the term "liquid epoxy resin" refers to an epoxy resin that is liquid at 20° C.

The assessment of liquid state is performed in accordance with Appendix 2 "Verification Method of Liquid State" of The Ministerial Ordinance on Testing and Nature of Hazardous Materials (Ministry of Home Affairs, Ordinance No. 1, 1989).

(1) Apparatus

Thermostat Water Bath:

A thermostat water bath which is equipped with a stirrer, a heater, a thermometer and an automatic temperature regulator (one capable of controlling the temperature within a range of ±0.1° C.) and has a depth of not less than 150 mm is used.

For the assessment of the epoxy resins used in the below-described Examples, a low-temperature thermostat water bath (model BU300) and an immersion-type thermostat apparatus THERMOMATE (model BF500), both of which are manufactured by Yamato Scientific Co., Ltd., were used in combination and, after loading about 22 L of tap water to the low-temperature thermostat water bath (model BU300), THERMOMATE (model BF500) integrated therewith was turned on and its temperature was set (at 20° C. or 40° C.), and the water temperature was then finely adjusted to ±0.1° C. of the preset temperature using THERMOMATE (model BF500). However, any apparatus capable of performing such adjustment can be used.

Figure 2A:
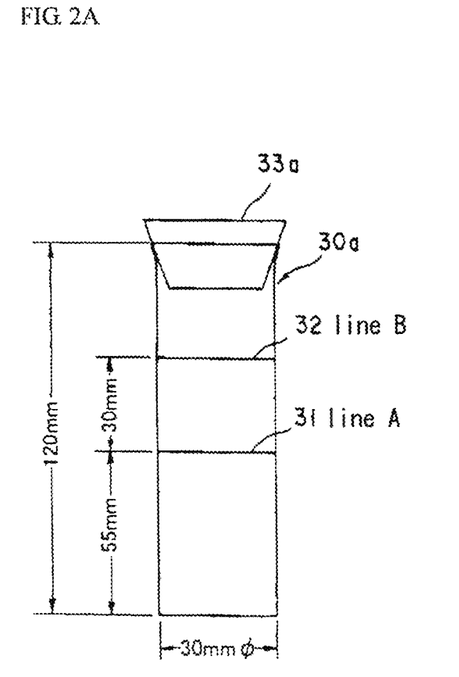
FIG. 2A and FIG. 2B are schematic side views showing the two test tubes used for assessing the liquid state of an epoxy resin.
Figure 2B:
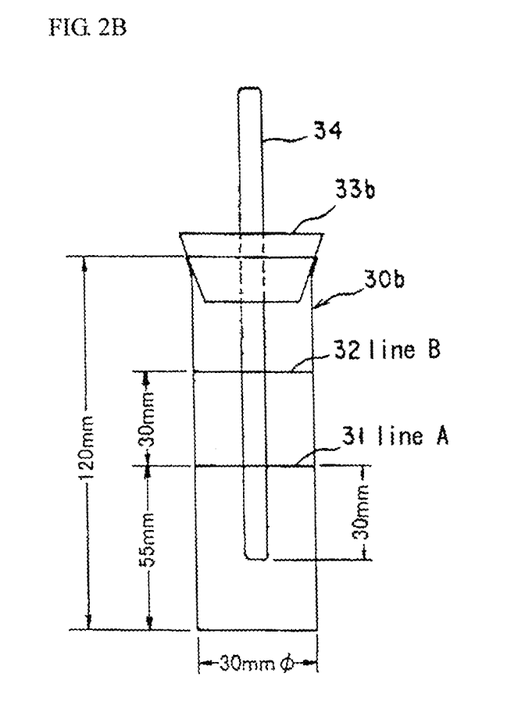

Test Tube:

As test tubes, as shown in FIG. 2, a test tube for liquid assessment 30a, which is a flat-bottomed cylindrical transparent glass test tube having an inner diameter of 30 mm and a height of 120 mm on which marked lines 31 and 32 are provided at heights of 55 mm and 85 mm from the tube bottom, respectively, and whose mouth is sealed with a rubber stopper 33a, and a test tube for temperature measurement 30b having the same size on which marked lines are provided in the same manner and whose mouth is sealed with a rubber stopper 33b having a hole in the center for insertion and support of a thermometer, through which rubber stopper 33b a thermometer 34 is inserted, are used. Hereinafter, the marked line provided at a height of 55 mm from the tube bottom is referred to as "line A" and the marked line provided at a height of 85 mm from the tube bottom is referred to as "line B".

As the thermometer 34, a thermometer for measurement of solidification point that is prescribed in JIS B7410 (1982) "Liquid-in-glass thermometers for testing of petroleum product" (SOP-58, scale range: 20 to 50° C.) is used;

however, any thermometer capable of measuring a temperature range of 0 to 50° C. can be used.

(2) Test Procedure

A sample left to stand at a temperature of 20±5° C. under atmospheric pressure for not less than 24 hours is placed in the test tube for liquid assessment 30a shown in FIG. 2(a) and the test tube for temperature measurement 30b shown in FIG. 2(b), each up to the line A. The two test tubes 30a and 30b are then placed vertically in the low-temperature thermostat water bath such that the line B comes below the water level. The thermometer is set such that its lower end is arranged 30 mm below the line A.

Once the sample temperature reached the preset temperature ±0.1° C., this condition is maintained for 10 minutes. After the 10 minutes, the test tube for liquid assessment 30a is taken out of the low-temperature thermostat water bath and immediately placed horizontally on a horizontal test bench, and the time required for the front edge of the liquid surface in the test tube to move from the line A to the line B is measured using a stopwatch and recorded. The sample is determined to be a liquid when the measured time is within 90 seconds at the preset temperature, or a solid when the measured time exceeds 90 seconds.

Examples of the solid epoxy resins include naphthalene-type epoxy resins, such as HP-4700 (naphthalene-type epoxy resin) manufactured by DIC Corporation, EXA4700 (tetrafunctional naphthalene-type epoxy resin) manufactured by DIC Corporation and NC-7000 (naphthalene skeleton-containing polyfunctional solid epoxy resin) manufactured by Nippon Kayaku Co., Ltd; epoxidized condensates of a phenol and a phenolic hydroxyl group-containing aromatic aldehyde (trisphenol-type epoxy resins), such as EPPN-502H (trisphenol epoxy resin) manufactured by Nippon Kayaku Co., Ltd.; dicyclopentadiene aralkyl-type epoxy resins such as EPICLON HP-7200H (dicyclopentadiene skeleton-containing polyfunctional solid epoxy resin) manufactured by DIC Corporation; biphenylaralkyl-type epoxy resins such as NC-3000H (biphenyl skeleton-containing polyfunctional solid epoxy resin) manufactured by Nippon Kayaku Co., Ltd.; biphenyl/phenol novolac-type epoxy resins such as NC-3000L manufactured by Nippon Kayaku Co., Ltd.; novolac-type epoxy resins, such as EPICLON N660 and EPICLON N690 manufactured by DIC Corporation, and EOCN-104S manufactured by Nippon Kayaku Co., Ltd.; biphenyl-type epoxy resins such as YX-4000 manufactured by Mitsubishi Chemical Corporation; phosphorus-containing epoxy resins such as TX0712 manufactured by Nippon Steel & Sumikin Chemical Co., Ltd.; and tris(2,3-epoxypropyl)isocyanurate such as TEPIC manufactured by Nissan Chemical Industries, Ltd.

Examples of the semisolid epoxy resins include bisphenol A-type epoxy resins, such as EPICLON 860, EPICLON 900-IM, EPICLON EXA-4816 and EPICLON EXA-4822 which are manufactured by DIC Corporation, ARALDITE AER280 manufactured by Asahi-Ciba Ltd., EPOTOHTO YD-134 manufactured by Tohto Kasei Co., Ltd., jER834 and jER872 manufactured by Japan Epoxy Resins Co., Ltd., and ELA-134 manufactured by Sumitomo Chemical Co., Ltd.; naphthalene-type epoxy resins such as EPICLON HP-4032 manufactured by DIC Corporation; and phenol novolac-type epoxy resins such as EPICLON N-740 manufactured by DIC Corporation.

Examples of the liquid epoxy resins include bisphenol A-type epoxy resins, bisphenol F-type epoxy resins, bisphenol AF-type epoxy resins, phenol novolac-type epoxy resins, tert-butyl-catechol-type epoxy resins, glycidylamine-type epoxy resins, aminophenol-type epoxy resins and alicyclic epoxy resins.

Examples of the polyfunctional oxetane compound include polyfunctional oxetanes such as bis[(3-methyl-3-oxetanylmethoxy)methyl]ether, bis[(3-ethyl-3-oxetanylmethoxy)methyl]ether, 1,4-bis[(3-methyl-3-oxetanylmethoxy)methyl]benzene, 1,4-bis[(3-ethyl-3-oxetanylmethoxy)methyl]benzene, (3-methyl-3-oxetanyl) methyl acrylate, (3-ethyl-3-oxetanyl)methyl acrylate, (3-methyl-3-oxetanyl)methyl methacrylate, (3-ethyl-3-oxetanyl)methyl methacrylate, and oligomers and copolymers thereof; and etherification products of an oxetane alcohol and a hydroxyl group-containing resin such as a novolac resin, a poly(p-hydroxystyrene), a cardo-type bisphenols, a calixarenes, a calixresorcinarenes or a silsesquioxane. Other examples include copolymers of an oxetane ring-containing unsaturated monomer(s) and an alkyl(meth)acrylate.

Examples of the episulfide resin include bisphenol A-type episulfide resins. Further, an episulfide resin or the like in which the oxygen atom of an epoxy group of an epoxy resin is substituted with a sulfur atom by the same synthetic method can also be used.

It is preferred that the thermosetting resin component be an epoxy compound. It is more preferred that the thermosetting resin component be at least one of solid epoxy resins and semi-solid epoxy resins, because this enables to obtain a cured article having a high glass transition temperature (Tg) and excellent cracking resistance. As the epoxy compound, from the standpoint of obtaining a cured article having preferred physical properties and the like, an aromatic epoxy resin is preferred. Among aromatic epoxy resins, naphthalene-type epoxy compounds and biphenyl-type epoxy compounds are more preferred. In the present specification, the term "aromatic epoxy resin" means an epoxy resin having an aromatic ring skeleton in its molecule.

The above-described thermosetting resin components may be used individually, or two or more thereof may be used in combination. The amount of the thermosetting resin component(s) to be incorporated is preferably 10 to 50% by weight, more preferably 20 to 40% by weight, still more preferably 20 to 35% by weight, based on the total amount of the resin layer of the dry film excluding said solvents. Further, when a liquid epoxy resin is incorporated, the glass transition temperature (Tg) of the resulting cured article is lowered and the cracking resistance may be impaired; therefore, the amount of the liquid epoxy resin to be incorporated is preferably 0 to 45% by weight, more preferably 0 to 30% by weight, particularly preferably 0 to 5% by weight, based on the total weight of the thermosetting resin component(s).

[Filler]

The resin layer of the dry film of the present invention contains a filler. By incorporating a filler, the thermal strength is adjusted with that of a conductor layer made of copper or the like arranged around an insulating layer, so that the thermal properties of the dry film can be improved. As the filler, any of conventionally known inorganic and organic fillers can be used and the filler is not restricted to a specific one; however, an inorganic filler that inhibits shrinkage on curing of the resulting coating film and contributes to improving the properties such as adhesiveness and hardness is preferred. Examples of the inorganic filler include extender pigments such as barium sulfate, barium titanate, amorphous silica, crystalline silica, molten silica, spherical silica, talc, clay, magnesium carbonate, calcium carbonate, aluminum oxide, aluminum hydroxide, silicon nitride and aluminum nitride; and metal powders of copper, tin, zinc, nickel, silver, palladium, aluminum, iron, cobalt, gold, platinum and the like. Among these inorganic fillers, silica and barium sulfate that are hardly deteriorated by a roughening solution are preferred, and spherical silica is particularly preferred because it has a low specific gravity and excellent low-thermal-expansion properties and can thus be incorporated into a composition at a high ratio. The average particle size of the filler is preferably 3 μm or smaller, more preferably 1 μm or smaller. The average particle size can be determined using a laser-diffraction particle size distribution analyzer.

The amount of the filler to be incorporated is preferably 1 to 90% by weight, more preferably 10 to 90% by weight, still more preferably 30 to 80% by weight, based on the total amount of the resin layer of the dry film excluding the solvents. When the amount of the filler is 1% by weight or greater, thermal expansion can be inhibited and the heat resistance can be improved, while when the amount of the filler is 90% by weight or less, the hardness of the resulting cured article is improved, so that cracking can be inhibited.

[Solvent]

The resin layer of the dry film of the present invention contains two solvents having a boiling point of 100° C. or higher and the boiling points of the two solvents are different by not less than 5° C. The difference in boiling point is preferably not less than 10° C., more preferably not less than 20° C. The solvents are not particularly restricted and conventionally known solvents having a boiling point of 100° C. or higher can be used. In the present invention, when a solvent has a range in its boiling point, a range from the initial boiling point to the end point of distillation is defined as the boiling point of the solvent.

Examples of a solvent having a boiling point of 100° C. or higher include isobutyl alcohol, toluene, methyl isobutyl ketone, n-butanol, butyl acetate, 2-methoxypropanol, isobutyl acetate, tetrachloroethylene, ethylene glycol monomethyl ether, methyl butyl ketone, isopentyl alcohol, ethylene glycol monoethyl ether, N,N-dimethylformamide (DMF), ethylene glycol monoethyl ether acetate, turpentine oil, cyclohexanone, ethylene glycol monobutyl ether, and γ-butyrolactone.

Other examples of a solvent having a boiling point of 100° C. or higher include xylene; petroleum naphtha; SWASOL 1000 (8 to 10 carbon atoms: high-boiling-point aromatic hydrocarbon) and SWASOL 1500 (high-boiling-point aromatic hydrocarbon), which are manufactured by Maruzen Petrochemical Co., Ltd.; SOLVESSO 100 (9 to 10 carbon atoms: high-boiling-point aromatic hydrocarbon) and SOLVESSO 150 (10 to 11 carbon atoms: high-boiling-point aromatic hydrocarbon), which are manufactured by Standard Sekiyu Osaka Hatsubaisho Co., Ltd.; SOLVENT #100 and SOLVENT #150, which are manufactured by Sankyo Chemical Co., Ltd.; SHELLSOL A100 and SHELLSOL A150, which are manufactured by Shell Chemicals Japan Ltd.; and IPSOL 100 (whose main component is an aromatic hydrocarbon having 9 carbon atoms) and IPSOL 150 (whose main component is an aromatic hydrocarbon having 10 carbon atoms), which are manufactured by Idemitsu Kosan Co., Ltd. It is preferred that the high-boiling-point aromatic hydrocarbons contain an aromatic component in an amount of not less than 99% by volume. Further, it is also preferred that the high-boiling-point aromatic hydrocarbons contain benzene, toluene and xylene, each in an amount of less than 0.01% by volume.

The resin layer of the dry film of the present invention may contain three or more solvents having a boiling point of 100° C. or higher and, in that case, any two of the solvents may have different boiling points. Among those solvents having a boiling point of 100° C. or higher, ones having a boiling point of 100 to 230° C. are preferred, and ones having a boiling point of 100 to 220° C. are more preferred. When the boiling point is 230° C. or lower, the solvent is unlikely to remain in the resin layer of the dry film after heat-curing or annealing process. As the solvents, toluene, N,N-dimethylformamide, cyclohexanone, petroleum naphtha and aromatic hydrocarbons having 8 or more carbon atoms are still more preferred.

In the present invention, it is also preferred that the solvents contain at least one of methyl isobutyl ketone, propylene glycol monomethyl ether acetate, 3-methoxy-3-methylbutyl acetate and diethylene glycol monoethyl ether acetate. Particularly, the at least two solvents of the present invention are preferably at least two selected from the group consisting of methyl isobutyl ketone, propylene glycol monomethyl ether acetate, 3-methoxy-3-methylbutyl acetate and diethylene glycol monoethyl ether acetate.

The amount of the solvents incorporated before drying is preferably 10 to 150 parts by weight, more preferably 25 to 100 parts by weight, with respect to 100 parts by weight of the resin layer of the dry film excluding the solvents. When the amount of the solvents is 10 parts by weight or greater, the solubility is improved and the amount of residual solvents can thus be easily adjusted, while when the amount of the solvents is 150 parts by weight or less, the thickness of the resin layer can be easily controlled.

The amount of the solvents incorporated after drying, that is, the ratio of the amount of residual solvents, is preferably 0.1 to 4% by weight, more preferably 0.3 to 3% by weight, based on the total amount of the resin layer of the dry film including the solvents.

The resin layer of the dry film of the present invention may also contain a solvent having a boiling point of lower than 100° C. Examples of the solvent having a boiling point of lower than 100° C. include diethyl ether, carbon disulfide, acetone, chloroform, methanol, n-hexane, ethyl acetate, 1,1,1-trichloroethane, carbon tetrachloride, methyl ethyl ketone, isopropyl alcohol, trichloroethylene and isopropyl acetate.

(Curing Agent)

The resin layer of the dry film of the present invention may contain a curing agent. Examples of the curing agent include phenol resins, polycarboxylic acids and anhydrides thereof, cyanate ester resins, and active ester resins. These curing agents may be used individually, or two or more thereof may be used in combination.

As the phenol resins, one or a combination of two or more of conventionally known phenol resins, such as phenol novolac resins, alkylphenol novolac resins, bisphenol A novolac resins, dicyclopentadiene-type phenol resins, Xylok-type phenol resins, terpene-modified phenol resins, cresol/naphthol resins, polyvinylphenols, phenol/naphthol resins, α-naphthol skeleton-containing phenol resins and triazine-containing cresol novolac resins, can be used.

The above-described polycarboxylic acids and anhydrides thereof are compounds having two or more carboxyl groups in one molecule and acid anhydrides thereof, examples of which include copolymers of (meth)acrylic acid, copolymers of maleic anhydride and condensates of dibasic acids as well as resins having a carboxylic acid terminal(s), such as carboxylic acid-terminated imide resins.

The above-described cyanate ester resins are compounds having two or more cyanate ester groups (—OCN) in one molecule. As a cyanate ester resin, any of conventionally known cyanate ester resins can be used. Examples of the cyanate ester resins include phenol novolac-type cyanate ester resins, alkylphenol novolac-type cyanate ester resins, dicyclopentadiene-type cyanate ester resins, bisphenol A-type cyanate ester resins, bisphenol F-type cyanate ester resins and bisphenol S-type cyanate ester resins. These cyanate ester resins may also be prepolymers that are partially triazinized.

The above-described active ester resins are resins having two or more active ester groups in one molecule. Generally, an active ester resin can be obtained by a condensation reaction between a carboxylic acid compound and a hydroxy compound. Particularly, an active ester compound obtained using a phenol compound or a naphthol compound as the hydroxy compound is preferred. Examples of the phenol compound or naphthol compound include hydroquinone, resorcin, bisphenol A, bisphenol F, bisphenol S, phenolphthalein, methylated bisphenol A, methylated bisphenol F, methylated bisphenol S, phenol, o-cresol, m-cresol, p-cresol, catechol, α-naphthol, β-naphthol, 1,5-dihydroxynaphthalene, 1,6-dihydroxynaphthalene, 2,6-dihydroxynaphthalene, dihydroxybenzophenone, trihydroxybenzophenone, tetrahydroxybenzophenone, phloroglucin, benzene triol, dicyclopentadienyl diphenol and phenol-novolac.

Further, as the curing agent, an alicyclic olefin polymer can also be used. Specific examples of a method of producing an alicyclic olefin polymer include: (1) a method of polymerizing an alicyclic olefin having a carboxyl group and/or a carboxylic acid anhydride group (hereinafter, referred to as "carboxyl group and/or the like") optionally with other monomer(s) as required; (2) a method of polymerizing an aromatic olefin having a carboxyl group and/or the like, optionally with other monomer(s) as required, to obtain a (co)polymer and then hydrogenating the aromatic ring moiety of the (co)polymer; (3) a method of copolymerizing an alicyclic olefin having no carboxyl group or the like with a monomer having a carboxyl group and/or the like; (4) a method of copolymerizing an aromatic olefin having no carboxyl group or the like with a monomer having a carboxyl group and/or the like to obtain a copolymer and then hydrogenating the aromatic ring moiety of the copolymer; (5) a method of introducing a compound having a carboxyl group and/or the like into an alicyclic olefin polymer having no carboxyl group or the like by a modification reaction; and (6) a method of preparing an alicyclic olefin polymer having a carboxylate group by any of the above-described methods (1) to (5) and then converting the carboxylate group into a carboxyl group by hydrolysis or the like.

Among curing agents, phenol resins, cyanate ester resins, active ester resins, and alicyclic olefin polymers are preferred.

It is preferred that the above-described curing agent be incorporated such that the ratio between a functional group of the thermosetting resin component that is capable of undergoing heat-curing reaction, such as an epoxy group, and the functional group of the curing agent that reacts with the functional group of the thermosetting resin component (the functional group of the curing agent/the functional group capable of undergoing heat-curing reaction (equivalence ratio)) is 0.2 to 2. By controlling this ratio (the functional group of the curing agent/the functional group capable of undergoing heat-curing reaction (equivalence ratio) within the above-described range, roughening of the film surface in the desmear step can be inhibited. The ratio, the functional group of the curing agent/the functional group capable of undergoing heat-curing reaction (equivalence ratio), is more preferably 0.2 to 1.5, still more preferably 0.3 to 1.0.

(Maleimide Compound)

The resin layer of the dry film of the present invention may also contain a maleimide compound. The maleimide compound is a compound having a maleimide skeleton and any of conventionally known maleimide compounds can be used. By incorporating a maleimide compound in the resin layer of the dry film of the present invention, the heat resistance, low warping properties and cracking resistance of the resulting cured article are improved.

It is preferred that the maleimide compound has two or more maleimide skeletons, and the maleimide compound is more preferably at least one of N,N-1,3-phenylene dimaleimide, N,N'-1,4-phenylene dimaleimide, N,N'-4,4-diphenylmethane bismaleimide, 1,2-bis(maleimide)ethane, 1,6-bismaleimide hexane, 1,6-bismaleimide-(2,2,4-trimethyl) hexane, 2,2'-bis-[4-(4-maleimidephenoxy)phenyl]propane, 3,3'-dimethyl-5,5'-diethyl-4,4'-diphenylmethane bismaleimide, 4-methyl-1,3-phenylene bismaleimide, bis(3-ethyl-5-methyl-4-maleimidephenyl)methane, bisphenol A diphenyl ether bismaleimide, polyphenylmethane maleimide, oligomers of these maleimide compounds and maleimide skeleton-containing diamine condensates. The above-described oligomers are oligomers obtained by condensation of a maleimide compound which is a monomer among the above-described maleimide compounds. These maleimide compounds may be used individually, or two or more thereof may be used in combination.

Among those, the maleimide compound is more preferably at least one of phenylmethane maleimide condensates and bismaleimide oligomers. The bismaleimide oligomers are preferably those obtained by condensation of phenylmethane bismaleimide and 4,4-diaminodiphenylmethane. Examples of commercially available phenylmethane maleimide condensates include BMI-2300 manufactured by Daiwa Fine Chemicals Co., Ltd. Examples of commercially available bismaleimide oligomer include DAIMAID-100H manufactured by Daiwa Fine Chemicals Co., Ltd.

Further, the maleimide compound is preferably one represented by the following Formula (I):

In the Formula (I), $R^1$ to $R^3$ each independently represent a hydrogen atom, a halogen atom or an organic group, and n represents an integer of 0 to 1. In the Formula (I), $R^1$ to $R^3$ are preferably hydrogen atoms.

It is also preferred that the maleimide compound be a mixture of maleimide compounds represented by the Formula (I). It is more preferred that the average value of n in the Formula (I) of the mixture be 0.1 to 1, because this improves the solubility of the mixture and further reduces the coefficient of linear expansion of the cured article of the resin layer. The larger the average n value, the higher becomes the solubility of the mixture. When a mixture of maleimide compounds having an average n value of 0.1 to 1 is incorporated, a cured article having a high glass transition temperature (Tg) can be formed even if the resin layer of the dry film is heat-cured at a low temperature, and this also makes it possible to use a thin substrate having a low heat resistance.

The amount of the maleimide compound(s) to be incorporated is preferably 2 to 50% by weight based on the total amount of the resin layer of the dry film excluding the solvents and filler. When this amount is 2% by weight or greater, the resulting cured article attains a low coefficient of linear expansion and the glass transition temperature (Tg) of the cured article is further increased. The amount of the maleimide compound(s) is more preferably 10% by weight or greater. Meanwhile, when the amount is 50% by weight or less, the breaking strength is improved.

(Thermoplastic Resin)

The resin layer of the dry film of the present invention may further contain a thermoplastic resin for improvement of the mechanical strength of the resulting cured coating film. The thermoplastic resin is preferably soluble to the solvents. When the thermoplastic resin is soluble to the solvents, the flexibility of the dry film is improved, so that cracking and powdering can be inhibited.

Examples of the thermoplastic resin include thermoplastic polyhydroxy polyether resins; phenoxy resins which are condensates of epichlorohydrin and various bifunctional phenol compounds; phenoxy resins in which the hydroxyl group of the hydroxyether moiety contained in the skeleton is esterified with various acid anhydrides or acid chlorides; polyvinylacetal resins; polyamide resins; polyamide imide resins; and block copolymers. These thermoplastic resins may be used individually, or two or more thereof may be used in combination.

A polyvinylacetal resin is obtained by, for example, acetalization of a polyvinyl alcohol resin with an aldehyde. The aldehyde is not particularly restricted, and examples thereof include formaldehyde, acetaldehyde, propionaldehyde and butylaldehyde.

Specific examples of the phenoxy resins include FX280 and FX293, which are manufactured by Tohto Kasei Co., Ltd.; and YX8100, YL6954 and YL6974, which are manufactured by Mitsubishi Chemical Corporation.

Specific examples of the polyvinylacetal resins include S-LEC KS Series manufactured by Sekisui Chemical Co., Ltd., and specific examples of the polyamide resins include KS5000 Series manufactured by Hitachi Chemical Co., Ltd. and BP Series manufactured by Nippon Kayaku Co., Ltd. Further, specific examples of the polyamide imide resins include KS9000 Series manufactured by Hitachi Chemical Co., Ltd.

A thermoplastic polyhydroxy polyether resin containing a fluorene skeleton has a high glass transition temperature and excellent heat resistance; therefore, it maintains a low coefficient of thermal expansion attributed to the semisolid or solid epoxy resin as well as the glass transition temperature of the semisolid or solid epoxy resin, so that the resulting cured coating film has a good balance of low coefficient of thermal expansion and high glass transition temperature.

Further, since a thermoplastic polyhydroxy polyether resin has hydroxyl groups, it shows good adhesion with a substrate and a conductor, and the resulting cured film is hardly deteriorated by a roughening agent and, since a roughening liquid in an aqueous solution form easily infiltrates into the interface between the cured film and a filler, a roughening treatment allows the filler on the cured film surface to easily fall off and this makes it easier to form a favorable roughened surface.

As the thermoplastic resin, a block copolymer may also be used. The term "block copolymer" refers to a copolymer having a molecular structure in which two or more polymers having different properties are linked via covalent bonds to form a long chain.

The block copolymer is preferably an A-B-A type or A-B-A' type block copolymer. Among A-B-A type and A-B-A' type block copolymers, ones that are constituted by a middle polymer unit B, which is a soft block having a low glass transition temperature (Tg) of preferably lower than 0° C., and outer polymer units A or A', which are hard blocks having a high glass transition temperature (Tg) of preferably 0° C. or higher, are preferred. The glass transition temperature (Tg) is measured by differential scanning calorimetry (DSC).

Further, among A-B-A type and A-B-A' type block copolymers, ones in which A or A' is a polymer unit having a glass transition temperature (Tg) of 50° C. or higher and B is a polymer unit having a glass transition temperature (Tg) of −20° C. or lower are more preferred.

Still further, among A-B-A type and A-B-A' type block copolymers, ones in which A or A' has a high miscibility with the above-described thermosetting resin components are preferred and B has a low miscibility with the above-described thermosetting resin components are preferred. It is believed that a block copolymer whose blocks of both ends are miscible with a matrix but the middle block is immiscible with the matrix in this manner is likely to exhibit a specific structure in the matrix.

Among those thermoplastic resins, phenoxy resins, polyvinylacetal resins, fluorene skeleton-containing thermoplastic polyhydroxy polyether resins and block copolymers are preferred.

It is preferred that the thermoplastic resin(s) be incorporated in an amount of 1 to 20 parts by weight, preferably 1 to 10 parts by weight, with respect to 100 parts by weight of the thermosetting resin component(s). When the amount of the thermoplastic resin(s) is outside the above-described range, it is difficult to attain a uniformly roughened surface state.

(Rubber Particle)

The resin layer of the dry film of the present invention may further contain rubber particles as required. Examples of the rubber particles include particles of polybutadiene rubber, polyisopropylene rubber, urethane-modified polybutadiene rubber, epoxy-modified polybutadiene rubber, acrylonitrile-modified polybutadiene rubber, carboxyl group-modified polybutadiene rubber, carboxyl group- or hydroxyl group-modified acrylonitrile-butadiene rubber; and cross-linked rubber particles and core shell-type rubber particles thereof. These rubber particles may be used individually, or two or more kinds thereof may be used in combination. These rubber particles are added for the purposes of improving the flexibility of the resulting cured coating film, improving the cracking resistance and enabling a surface roughening treatment with an oxidizing agent so as to improve the strength of adhesion with a copper foil and the like.

The average particle size of the rubber particles is in a range of preferably 0.005 to 1 µm, more preferably 0.2 to 1 µm. In the present invention, the average particle size of the rubber particles can be measured by a dynamic light scattering method. For example, the rubber particles are uniformly dispersed in an appropriate organic solvent by ultrasonication or the like, the weight-based particle size distribution of the rubber particles is determined using FPRA-1000 (manufactured by Otsuka Electronics Co., Ltd.) and the median diameter thereof can be defined as the average particle size.

The amount of the rubber particles to be incorporated is preferably 0.5 to 10 parts by weight, more preferably 1 to 5 parts by weight, with respect to 100 parts by weight of the thermosetting resin component. When the amount of the rubber particles is 0.5 parts by weight or greater, the cracking resistance is provided and the strength of adhesion with a conductor pattern and the like can be improved. Meanwhile, when the amount of the rubber particles is 10 parts by weight or less, the coefficient of thermal expansion (CTE) is reduced and the glass transition temperature (Tg) is increased, so that the curing properties are improved.

(Curing Accelerator)

The resin layer of the dry film of the present invention may contain a curing accelerator. The curing accelerator facilitates the heat-curing reaction and is used for further improving the properties such as adhesion, chemical resistance and heat resistance. Specific examples of such a curing accelerator include: imidazole and derivatives thereof; guanamines such as acetoguanamine and benzoguanamine; polyamines such as diaminodiphenyl methane, m-phenylenediamine, m-xylenediamine, diaminodiphenylsulfone, dicyanediamide, urea, urea derivatives, melamine and polybasic hydrazides; organic acid salts and/or epoxy adducts thereof; amine complexes of boron trifluoride; triazine derivatives such as ethyldiamino-S-triazine, 2,4-diamino-S-triazine and 2,4-diamino-6-xylyl-S-triazine; amines such as trimethylamine, triethanolamine, N,N-dimethyloctylamine, N-benzyldimethylamine, pyridine, N-methylmorpholine, hexa(N-methyl)melamine, 2,4,6-tris(dimethylaminophenol), tetramethylguanidine and m-aminophenol; polyphenols such as polyvinylphenol, polyvinylphenol bromide, phenol novolac and alkylphenol novolac; organic phosphines such as tributylphosphine, triphenylphosphine and tris-2-cyanoethylphosphine; phosphonium salts such as tri-n-butyl(2,5-dihydroxyphenyl)phosphonium bromide and hexadecyltributyl phosphonium chloride; quaternary ammonium salts such as benzyltrimethyl ammonium chloride and phenyltributyl ammonium chloride; the above-described polybasic acid anhydrides; photocation polymerization catalysts such as diphenyliodonium tetrafluoroborate, triphenylsulfonium hexafluoroantimonate and 2,4,6-triphenylthiopyrylium hexafluorophosphate; styrene-maleic anhydride resins; and conventionally known curing accelerators, such as equimolar reaction products of phenylisocyanate and dimethylamine, equimolar reaction products of an organic polyisocyanate (e.g. tolylenediisocyanate, isophorone diisocyanate) and dimethylamine, and metal catalysts. Among these curing accelerators, phosphonium salts are preferred because they provide BHAST resistance.

The above-described curing accelerators may be used individually, or two or more thereof may be used in combination. The use of a curing accelerator is not indispensable; however, particularly when it is desired to facilitate curing, the curing accelerator(s) can be used in an amount of preferably 0.01 to 5 parts by weight with respect to 100 parts by weight of the thermosetting resin component. In the case of a metal catalyst, the amount thereof is preferably 10 to 550 ppm, more preferably 25 to 200 ppm, in terms of the metal with respect to 100 parts by weight of the thermosetting resin component.

(Other Components)

The resin layer of the dry film of the present invention may further contain, as required, a conventionally known coloring agent such as phthalocyanine blue, phthalocyanine green, iodine green, disazo yellow, crystal violet, titanium oxide, carbon black or naphthalene black; a conventionally known thickening agent such as asbestos, orben, benton or fine powder silica; a silicone-based, fluorine-based or polymer-based antifoaming agent and/or leveling agent; an adhesion-promoting agent such as a thiazole-based or triazole-based adhesion-promoting agent or a silane coupling agent; a flame retardant; and a titanate-based or aluminum-based conventionally known additives.

The dry film of the present invention can be produced by coating and drying the thermosetting resin composition for the resin layer formation on a carrier film and then, as required, laminating a protective film thereon to form a dry coating film.

As the material of the carrier film, polyethylene terephthalate (PET) can be preferably used, and a polyester such as polyethylene naphthalate, a polypropylene (PP), a polycarbonate or the like can also be used. The thickness of the carrier film is preferably 8 to 60 μm.

As the material of the protective film, the same material as that of the carrier film can be used, and it is preferably PET or PP. The thickness of the protective film is preferably 5 to 50 μm.

Here, as a method of coating the thermosetting resin composition, a known method such as screen printing can be employed. Further, as an evaporation drying method, a known method using a hot air circulation-type drying oven or the like can be employed.

The printed wiring board of the present invention comprises a cured article obtained by curing the dry film of the present invention. The production method thereof will be described below; however, it is not restricted to the below-described method.

The dry film of the present invention is obtained by coating a heat-curable composition on a support base film and subsequently drying solvents. The term "heat-curable composition" used herein refers to a composition containing a thermosetting resin component, a filler and at least two solvents, wherein the at least two solvents both have a boiling point of 100° C. or higher and the boiling points of the at least two solvents are different by not less than 5° C.

Examples of the support base film include films made of a polyolefin such as polyethylene or polyvinyl chloride, a polyester such as polyethylene terephthalate, a polycarbonate, or a polyimide; mold-release papers; and metal foils such as a copper foil and an aluminum foil. The support base film may already have been subjected to a matting treatment, a corona treatment and/or a mold-releasing treatment.

The dry film of the present invention may be heat-laminated on an inner-layer circuit board having a circuit formed thereon and the resultant may be integrally molded and subsequently cured in an oven or by hot-plate pressing. In the above-described processes, the lamination or hot-plate pressing method is preferred because fine irregularities attributed to the inner-layer circuit are eliminated by heat-melting and the resultant is cured as it is, so that a multi-layer board with flat surface can be eventually obtained. Further, when the dry film of the present invention is laminated or hot-pressed on a base material having an inner-layer circuit formed thereon, a copper foil or a circuit-formed board may also be laminated simultaneously.

On a substrate obtained in this manner, a hole(s) is/are made using a semiconductor laser such as $CO_2$ laser or UV-YAG laser or a drill. The hole may be a penetrating hole (through-hole) for conduction between the front and the back of the substrate, or a partial hole (conformal via) for conduction between the inner-layer circuit and a circuit formed on the surface of an interlayer insulating layer.

After the hole formation, for the purposes of removing residues (smear) existing on the inner wall and bottom of the hole(s) and forming a roughened surface with fine irregularities on the substrate surface so as to allow the substrate to exhibit an effect of anchoring a conductor layer (a metal plating layer to be formed later), a treatment with a commercially available desmear solution (roughening agent) or a roughening solution containing an oxidizing agent such as permanganate, bichromate, ozone, hydrogen peroxide/sulfuric acid or nitric acid is performed at the same time.

Next, after the hole(s) from which residues have been removed with the desmear solution and the coating film with roughened surface having fine irregularities are formed, a circuit is formed by, for example, a subtractive method or a semi-additive method. In either method, after subjecting the resultant to either or both of electroless plating and electrolytic plating, a heat treatment called "annealing" may be performed at about 80 to 180° C. for 10 to 60 minutes or so for the purposes of removing stress in the metal and improving the strength.

The metal plating used here is not particularly restricted to copper, tin, solder, nickel or the like, and a plurality of metals can be used in combination. Alternatively, the metal plating used here can be replaced by metal sputtering or the like.

The dry film of the present invention can be suitably used for producing a printed wiring board. Particularly, the dry film of the present invention can be suitably used for forming an insulating layer of a printed wiring board, such as an interlayer insulating layer or a solder resist layer. A wiring board may also be formed by pasting wires using the dry film of the present invention. Furthermore, the dry film of the present invention can also be suitably used as a sealing resin for semiconductor chips.

EXAMPLES

The present invention will now be described concretely by way of examples, comparative examples and test examples thereof; however, the present invention is not restricted thereto by any means. In the followings, unless otherwise specified, all "part(s)" and "%" are by weight.

Examples 1 to 19 and Comparative Examples 1 to 3

According to the respective formulations shown in Tables 1 to 4 below, the components were kneaded and dispersed and the resultants were each adjusted to have a viscosity of 0.5 to 20 dPa·s (rotational viscometer, 5 rpm, 25° C.), thereby obtaining thermosetting resin compositions. Using a bar coater, the thus obtained thermosetting resin compositions were each coated on a carrier film (PET film; LUMIRROR 38R75 manufactured by Toray Industries, Inc.: thickness=38 μm) at a post-drying film thickness of 40 μm and subsequently dried for the time period at the temperature as shown in Tables 5 to 8 below, and a protective film was laminated thereon to obtain a dry film. The alicyclic olefin polymers A1 and A2 contained in the thermosetting resin composition of Example 19 were produced as described below.

(Production Example 1 of Alicyclic Olefin Polymer)

To a nitrogen-substituted pressure-resistant glass reactor, 70 parts by mol of tetracyclo[9.2.1.0$^{2,10}$.0$^{3,8}$]tetradeca-3,5,7,12-tetraene (methanotetrahydrofluorene; hereinafter, abbreviated as "MTF"), 30 parts by mol of bicyclo[2.2.1]hept-2-ene-5,6-dicarboxylic anhydride (hereinafter, abbreviated as "NDCA"), 0.9 parts by mol of 1-hexene, 590 parts by mol of anisole and 0.015 parts by mol of 4-acetoxybenzylidene(dichloro)(4,5-dibromo-1,3-dimesityl-4-imidazolin-2-ylidene)(tricycloh exylphosphine)ruthenium (manufactured by Wako Pure Chemical Industries, Ltd.) as a ruthenium-based polymerization catalyst were loaded, and these loaded materials were allowed to undergo a polymerization reaction at 80° C. for 1 hour under stirring, thereby obtaining a ring-opening polymer solution. Then, the thus obtained ring-opening polymer solution was loaded to a nitrogen-substituted autoclave equipped with a stirrer and stirred for 5 hours at a temperature of 150° C. under a hydrogen pressure of 7 MPa to perform hydrogenation reaction, thereby obtaining a solution of a high-molecular-weight alicyclic olefin polymer. The thus obtained alicyclic olefin polymer had a weight-average molecular weight of 50,000, a number-average molecular weight of 26,000 and a molecular weight distribution of 1.9. Further, the hydrogenation rate was 97% and the content of carboxylic anhydride group-containing repeating units was 30% by mol. The solution of the alicyclic olefin polymer had a solid concentration of 40%. The thus obtained alicyclic olefin polymer is hereinafter referred to as "alicyclic olefin polymer A1".

(Production Example 2 of Alicyclic Olefin Polymer)

To a nitrogen-substituted pressure-resistant glass reactor, 70 parts by mol of MTF, 30 parts by mol of NDCA, 6 parts by mol of 1-hexene, 590 parts by mol of anisole and 0.015 parts by mol of 4-acetoxybenzylidene(dichloro)(4,5-dibromo-1,3-dimesityl-4-imidazolin-2-ylidene)(tricycloh exylphosphine)ruthenium (manufactured by Wako Pure Chemical Industries, Ltd.) as a ruthenium-based polymerization catalyst were loaded, and these loaded materials were allowed to undergo a polymerization reaction at 80° C. for 1 hour under stirring, thereby obtaining a ring-opening polymer solution. Then, the thus obtained ring-opening polymer solution was loaded to a nitrogen-substituted autoclave equipped with a stirrer and stirred for 5 hours at a temperature of 150° C. under a hydrogen pressure of 7 MPa to perform hydrogenation reaction, thereby obtaining a solution of a low-molecular-weight alicyclic olefin polymer. The thus obtained low-molecular-weight alicyclic olefin polymer had a weight-average molecular weight of 10,000, a number-average molecular weight of 5,000 and a molecular weight distribution of 2. Further, the hydrogenation rate was 97% and the content of carboxylic anhydride group-containing repeating units was 30% by mol. From the thus obtained solution, anisole was removed by evaporation under reduced pressure so as to adjust the solid concentration to 60%. The thus obtained alicyclic olefin polymer is hereinafter referred to as "alicyclic olefin polymer A2".

TABLE 1

| | | Example | | | | | | | | |
|---|---|---|---|---|---|---|---|---|---|---|
| | | 1 | 2 | 3 | 4 | 5 | 6 | 7 | 8 | 9 |
| Liquid epoxy resin | jER828*[1] | — | — | — | — | — | — | — | — | — |
| | jER807*[2] | — | — | — | — | — | — | — | — | — |
| | YL7723*[3] | — | — | — | — | — | — | — | — | — |

TABLE 1-continued

| | | Example | | | | | | | | |
|---|---|---|---|---|---|---|---|---|---|---|
| | | 1 | 2 | 3 | 4 | 5 | 6 | 7 | 8 | 9 |
| Solid epoxy resin | HP-4700*[4] | — | — | — | — | — | — | — | — | — |
| | NC-3000L*[5] | 5.6 | 5.6 | 5.6 | 5.6 | 5.6 | 5.6 | 5.7 | 5.6 | 5.6 |
| | YX-4000*[6] | 3.0 | 3.0 | 3.0 | 3.0 | 3.0 | 3.0 | 3.1 | 3.0 | 3.0 |
| | TX0712*[7] | — | — | — | — | — | — | — | — | — |
| Semi-solid epoxy resin | HP-4032*[8] | 6.0 | 6.0 | 6.0 | 6.0 | 6.0 | 6.0 | 6.0 | 6.0 | 6.0 |
| Curing agent | HF-1M*[9] | — | — | — | — | — | — | — | — | — |
| | HPC-9500*[10] | 11.0 | 11.0 | 11.0 | 11.0 | 11.0 | 11.0 | 11.1 | 11.0 | 11.0 |
| | LA3018*[11] | — | — | — | — | — | — | — | — | — |
| | EXB9460S*[12] | — | — | — | — | — | — | — | — | — |
| | BA230*[13] | — | — | — | — | — | — | — | — | — |
| | PT30*[14] | — | — | — | — | — | — | — | — | — |
| Thermoplastic resin | YX6954*[15] | — | — | — | — | — | — | — | — | — |
| | FX-293*[16] | 1.5 | 1.5 | 1.5 | 1.5 | 1.5 | 1.5 | 1.5 | 1.5 | 1.5 |
| | KS-1*[17] | 1.5 | 1.5 | 1.5 | 1.5 | 1.5 | 1.5 | 1.5 | 1.5 | 1.5 |
| Rubber particle | AC-3816N*[18] | 2.0 | 2.0 | 2.0 | 2.0 | 2.0 | 2.0 | 2.0 | 2.0 | 2.0 |
| Flame retardant | HCA-HQ*[19] | 2.0 | 2.0 | 2.0 | 2.0 | 2.0 | 2.0 | 2.0 | 2.0 | 2.0 |
| Inorganic filler | SO-C2*[20] | 67.0 | 67.0 | 67.0 | 67.0 | 67.0 | 67.0 | 67.0 | 67.0 | 67.0 |
| | B-30*[21] | — | — | — | — | — | — | — | — | — |
| Curing accelerator | 2E-4MZ*[22] | 0.4 | 0.4 | 0.4 | 0.4 | 0.4 | 0.4 | — | 0.4 | 0.4 |
| | P200*[23] | — | — | — | — | — | — | — | — | — |
| | TPP-MK*[24] | — | — | — | — | — | — | 0.1 | — | — |
| | 4APy*[25] | — | — | — | — | — | — | — | — | — |
| | NapZn(II)*[26] | — | — | — | — | — | — | — | — | — |
| Organic solvent | Toluene*[27] | 5.0 | 5.0 | 5.0 | 10.0 | 35.0 | — | — | 5.0 | 5.0 |
| | 2-methoxypropanol*[28] | — | — | — | — | — | — | — | — | — |
| | Cyclohexanone*[29] | 30.0 | 25.0 | 20.0 | 35.0 | — | 35.0 | 35.0 | 32.0 | 30.0 |
| | DMF*[30] | — | 5.0 | — | — | — | — | — | — | — |
| | IPSOL 150*[31] | 10.0 | 10.0 | 10.0 | — | 10.0 | 10.0 | 10.0 | 8.0 | 10.0 |
| | MEK*[32] | — | — | 10.0 | — | — | — | — | — | — |
| | Hexane*[33] | — | — | — | — | — | — | — | — | — |
| Total amount (excluding solvents) (parts by weight) | | 100.0 | 100.0 | 100.0 | 100.0 | 100.0 | 100.0 | 100.0 | 100.0 | 100.0 |

TABLE 2

| | | Example | | | | | | | | |
|---|---|---|---|---|---|---|---|---|---|---|
| | | 10 | 11 | 12 | 13 | 14 | 15 | 16 | 17 | 18 |
| Liquid epoxy resin | jER828*[1] | — | — | — | 1.5 | 6.5 | 9.8 | — | 11.0 | — |
| | jER807*[2] | — | — | — | 2.0 | 6.5 | 9.8 | — | — | — |
| | YL7723*[3] | — | — | — | — | — | — | — | — | 14.5 |
| Solid epoxy resin | HP-4700*[4] | — | — | — | — | 1.6 | 2.5 | — | — | — |
| | NC-3000L*[5] | 18.1 | 12.8 | 3.1 | 15.0 | 7.5 | 12.0 | 8.9 | 11.0 | 7.0 |
| | YX-4000*[6] | 9.7 | 6.9 | 1.6 | 3.1 | — | 4.8 | — | — | — |
| | TX0712*[7] | — | — | — | — | — | — | — | — | 5.5 |
| Semi-solid epoxy resin | HP-4032*[8] | 19.4 | 13.8 | 3.3 | 1.5 | — | — | 9.6 | — | — |
| Curing agent | HF-1M*[9] | — | — | — | — | 10.5 | 16.0 | — | — | — |
| | HPC-9500*[10] | 35.6 | 25.2 | 6.0 | 10.0 | — | — | 17.5 | — | — |
| | LA3018*[11] | — | — | — | — | — | — | — | 9.5 | — |
| | EXB9460S*[12] | — | — | — | — | — | — | — | 2.2 | — |
| | BA230*[13] | — | — | — | — | — | — | — | — | 11.0 |
| | PT30*[14] | — | — | — | — | — | — | — | — | 4.5 |
| Thermoplastic resin | YX6954*[15] | — | — | — | — | 1.5 | 6.0 | — | 1.5 | 2.2 |
| | FX-293*[16] | 4.9 | 3.4 | 0.8 | 1.5 | — | — | 2.4 | — | — |
| | KS-1*[17] | 4.9 | 3.4 | 0.8 | 1.5 | 1.5 | 0.5 | 2.4 | — | — |
| Rubber particle | AC-3816N*[18] | 2.0 | 2.0 | 2.0 | 2.0 | 2.0 | 2.0 | 2.0 | — | — |
| Flame retardant | HCA-HQ*[19] | 2.0 | 2.0 | 2.0 | 1.5 | 2.0 | 5.0 | 2.0 | — | — |
| Inorganic filler | SO-C2*[20] | 3.0 | 30.0 | 80.0 | 60.0 | 60.0 | 36.0 | — | 64.7 | 55.0 |
| | B-30*[21] | — | — | — | — | — | — | 50.0 | — | — |
| Curing accelerator | 2E-4MZ*[22] | 0.4 | 0.4 | 0.4 | 0.4 | 0.4 | 0.4 | 0.4 | — | — |
| | P200*[23] | — | — | — | — | — | — | — | — | 0.2 |
| | TPP-MK*[24] | — | — | — | — | — | — | — | — | — |
| | 4APy*[25] | — | — | — | — | — | — | — | 0.1 | — |
| | NapZn(II)*[26] | — | — | — | — | — | — | — | — | 0.1 |
| Organic solvent | Toluene*[27] | 5.0 | 5.0 | 5.0 | 10 | 10 | 10 | 5.0 | 7.0 | — |
| | 2-methoxypropanol*[28] | — | — | — | — | — | — | — | 3.0 | — |
| | Cyclohexanone*[29] | 30.0 | 30.0 | 30.0 | 30 | 30 | 30 | 30.0 | 17.5 | 8.0 |

TABLE 2-continued

|  | | Example | | | | | | | | |
|---|---|---|---|---|---|---|---|---|---|---|
|  |  | 10 | 11 | 12 | 13 | 14 | 15 | 16 | 17 | 18 |
| DMF[30] | | — | — | — | — | — | — | — | — | — |
| IPSOL 150[31] | | 10.0 | 10.0 | 10.0 | 5 | 5 | 5 | 10.0 | — | 17.0 |
| MEK[32] | | — | — | — | — | — | — | — | 17.5 | 20.0 |
| Hexane[33] | | — | — | — | — | — | — | — | — | — |
| Total amount (excluding solvents) (parts by weight) | | 100.0 | 100.0 | 100.0 | 100.0 | 100.0 | 100.0 | 100.0 | 100.0 | 100.0 |

TABLE 3

|  |  | Example 19 |
|---|---|---|
| Liquid epoxy resin | jER828[1] | — |
|  | jER807[2] | — |
|  | YL7723[3] | — |
| Solid epoxy resin | HP-4700[4] | — |
|  | NC-3000L[5] | — |
|  | YX-4000[6] | — |
|  | TX0712[7] | — |
|  | HP-7200[34] | 2.5 |
|  | CG-500[35] | 11.0 |
| Semi-solid epoxy resin | HP-4032[8] | — |
| Curing agent | HF-1M[9] | — |
|  | HPC-9500[10] | — |
|  | LA3018[11] | — |
|  | GDP-6085[36] | 6.5 |
|  | NV-203-R4[37] | 3.0 |
|  | EXB9460S[12] | — |
|  | BA230[13] | — |
|  | PT30[14] | — |
| Alicyclic olefin polymer | Alicyclic olefin polymer A1 | 0.2 |
|  | Alicyclic olefin polymer A2 | 2.3 |
| Thermoplastic resin | YX6954[15] | — |
|  | FX-293[16] | 1.5 |
|  | KS-1[17] | 1.5 |
| Rubber particle | AC-3816N[18] | 2.0 |
| Flame retardant | HCA-HQ[19] | 2.0 |
| Inorganic filler | SO-C2[20] | 67.0 |
|  | B-30[21] | — |
| Curing accelerator | 2E-4MZ[22] | 0.4 |
|  | P200[23] | — |
|  | TPP-MK[24] | — |
|  | 4APy[25] | — |
|  | NapZn(II)[26] | — |
| Organic solvent | Toluene[27] | 5.0 |
|  | 2-methoxypropanol[28] | — |
|  | Cyclohexanone[29] | 27.5 |
|  | DMF[30] | — |
|  | Anisole[38] | 2.5 |
|  | IPSOL 150[31] | 10.0 |
|  | MEK[32] | — |
|  | Hexane[33] | — |
| Total amount (excluding solvents) (parts by weight) | | 100.0 |

TABLE 4

|  |  | Comparative Example | | |
|---|---|---|---|---|
|  |  | 1 | 2 | 3 |
| Liquid epoxy resin | jER828[1] | — | — | — |
|  | jER807[2] | — | — | — |
|  | YL7723[3] | — | — | — |
| Solid epoxy resin | HP-4700[4] | — | — | — |
|  | NC-3000L[5] | 5.6 | 5.6 | 5.6 |
|  | YX-4000[6] | 3.0 | 3.0 | 3.0 |
|  | TX0712[7] | — | — | — |
| Semi-solid epoxy resin | HP-4032[8] | 6.0 | 6.0 | 6.0 |
| Curing agent | HF-1M[9] | — | — | — |
|  | HPC-9500[10] | 11.0 | 11.0 | 11.0 |
|  | LA3018[11] | — | — | — |
|  | EXB9460S[12] | — | — | — |
|  | BA230[13] | — | — | — |
|  | PT30[14] | — | — | — |
| Thermoplastic resin | YX6954[15] | — | — | — |
|  | FX-293[16] | 1.5 | 1.5 | 1.5 |
|  | KS-1[17] | 1.5 | 1.5 | 1.5 |
| Rubber particle | AC-3816N[18] | 2.0 | 2.0 | 2.0 |
| Flame retardant | HCA-HQ[19] | 2.0 | 2.0 | 2.0 |
| Inorganic filler | SO-C2[20] | 67.0 | 67.0 | 67.0 |
|  | B-30[21] | — | — | — |
| Curing accelerator | 2E-4MZ[22] | 0.4 | 0.4 | 0.4 |
|  | P200[23] | — | — | — |
|  | TPP-MK[24] | — | — | — |
|  | 4APy[25] | — | — | — |
|  | NapZn(II)[26] | — | — | — |
| Organic solvent | Toluene[27] | — | — | — |
|  | 2-methoxypropanol[28] | — | — | — |
|  | Cyclohexanone[29] | — | — | 22.5 |
|  | DMF[30] | — | — | 22.5 |
|  | IPSOL 150[31] | 30.0 | — | — |
|  | MEK[32] | — | — | — |
|  | Hexane[33] | 15.0 | 45.0 | — |
| Total amount (excluding solvents) (parts by weight) | | 100.0 | 100.0 | 100.0 |

[1] bisphenol A-type epoxy resin (manufactured by Mitsubishi Chemical Corporation; epoxy equivalent = 184 to 194 g/eq; liquid)
[2] bisphenol F-type epoxy resin (manufactured by Mitsubishi Chemical Corporation; epoxy equivalent = 160 to 175 g/eq; liquid)
[3] bisphenol AF-type epoxy resin (manufactured by Mitsubishi Chemical Corporation; epoxy equivalent = 243 g/eq; crystalline liquid)
[4] naphthalene-type epoxy resin (manufactured by DIC Corporation; epoxy equivalent = 160 to 170 g/eq; softening point = 85 to 95° C.)
[5] biphenyl/phenol novolac-type epoxy resin (manufactured by Nippon Kayaku Co., Ltd.; epoxy equivalent = 272 g/eq; softening point = 52° C.)
[6] tetramethylbiphenyl-type epoxy resin (manufactured by Mitsubishi Chemical Corporation; epoxy equivalent = 180 to 192 g/eq; softening point = 105° C.)
[7] phosphorus-containing epoxy resin (manufactured by Nippon Steel & Sumikin Chemical Co., Ltd.; epoxy equivalent = 355 g/eq; phosphorus content = 2.6%)
[8] naphthalene-type epoxy resin (manufactured by DIC Corporation; epoxy equivalent = 145 to 157 g/eq; semisolid)
[9] phenol novolac resin (manufactured by Meiwa Plastic Industries, Ltd.; hydroxyl equivalent = 104 to 108 g/eq; softening point = 82 to 86° C.)
[10] α-naphthol skeleton-containing phenol resin (manufactured by DIC Corporation; hydroxyl equivalent = 150 g/eq, softening point = 110 to 140° C.)
[11] triazine-containing cresol novolac resin (manufactured by DIC Corporation; hydroxyl equivalent = 151 g/eq; nitrogen content = 18%)
[12] active ester compound (manufactured by DIC Corporation; active ester equivalent = 223 g/eq)
[13] bisphenol A dicyanate (manufactured by LONZA Japan; cyanate equivalent = 232 g/eq)
[14] phenol novolac-type polyfunctional cyanate ester (manufactured by LONZA Japan; cyanate equivalent = 124 g/eq)
[15] phenoxy resin (manufactured by Mitsubishi Chemical Corporation; glass transition temperature = 130° C.)
[16] fluorene + tetramethylbiphenyl skeleton-containing phenoxy resin (manufactured by Tohto Kasei Co., Ltd.; glass transition temperature = 163° C.)
[17] polyvinyl acetoacetal (manufactured by Sekisui Chemical Co., Ltd.; glass transition temperature = 107° C.)
[18] core-shell rubber particle (manufactured by Aica Kogyo Co., Ltd.)
[19] phenolic hydroxyl group-containing phosphorus compound (manufactured by Sanko-sha Co., Ltd.)
[20] spherical silica (manufactured by Admatechs Co., Ltd.; average particle size = 0.5 μm)
[21] barium sulfate (manufactured by Sakai Chemical Industry Co., Ltd.; average particle size = 0.3 μm)

TABLE 4-continued

| | Comparative Example | | |
|---|---|---|---|
| | 1 | 2 | 3 |

*[22]2-ethyl-4-methylimidazole (manufactured by Shikoku Chemicals Corporation)
*[23]adduct of an imidazole compound and an epoxy resin (manufactured by Mitsubishi Chemical Corporation)
*[24]phosphonium salt (manufactured by Hokko Sangyo Co., Ltd.)
*[25]4-aminopyridine (manufactured by Koei Chemical Co., Ltd.)
*[26]zinc (II) naphthenate mineral spirit (manufactured by Wako Pure Chemical Industries, Ltd.; zinc content = 8%)
*[27]toluene (boiling point = 110° C.)
*[28]2-methoxypropanol (boiling point = 118° C.)
*[29]cyclohexanone (boiling point = 150° C.)
*[30]DMF (N,N-dimethylformamide; boiling point = 153° C.)
*[31]IPSOL 150 (boiling point: 184 to 205° C.)
*[32]MEK (methyl ethyl ketone; boiling point = 79.5° C.)
*[33]hexane (boiling point = 69° C.)
*[34]dicyclopentadiene-type epoxy resin (manufactured by DIC Corporation; epoxy equivalent = 254 to 264 g/eq; softening point = 56 to 66° C.)
*[35]fluorene-based epoxy resin (manufactured by Osaka Gas Chemicals Co., Ltd.; epoxy equivalent = 311 g/eq; softening point = 140° C.)
*[36]dicyclopentadiene-type phenol resin (manufactured by Gunei Chemical Industry Co., Ltd.; hydroxyl equivalent = 164 to 167 g/eq; softening point = 85 to 89° C.)
*[37]fluorene-based phenol resin (manufactured by Osaka Gas Chemicals Co., Ltd.; hydroxyl equivalent = 190 g/eq; softening point = 142° C.)
*[38]anisole (manufactured by Kishida Chemical Co., Ltd.; boiling point = 156° C.)

The dry films of Examples 1 to 19 and Comparative Examples 1 to 3 were evaluated by the below-described evaluation methods. The evaluation results are shown in Tables 5 to 8.

<Measurement of Content of Residual Organic Solvents in Dry Film (%)>

After removing the carrier film and the protective film from each of the dry films of Examples and Comparative Examples, about 1.2 g of the resin layer was collected and placed in a stopper-equipped container to precisely measure the mass of the collected resin layer (W). To this container, as an internal standard substance, one drop of ethyl 3-ethoxypropionate was added using a pipette, and the mass thereof (We) was precisely measured. Then, 5 ml of acetone was further added using a transfer pipette, and the container was tightly sealed and shaken sufficiently to dissolve the collected resin layer. Thereafter, the resulting solution was filtered through a 0.5 μm-mesh filter, and the composition of the filtrate was analyzed by gas chromatography (TRACE GC ULTRA, manufactured by Thermo Fisher Scientific K.K.). From a separately prepared calibration curve, the mass of the organic solvents with respect to 1 g of the internal standard substance was determined (Ws). From the thus obtained values, the content of residual organic solvents was calculated using the following equation:

Content of residual organic solvents (% by mass)= $(We \times Ws/W) \times 100$.

The measurement conditions in the gas chromatography were as follows.

Column: capillary column DB-1MS (30 m×0.25 mm), manufactured by Agilent Technologies, Inc.
Detector: MS(ITQ900)
Carrier gas: helium
Injector temperature: 300° C.
Detector temperature: 230° C.
Column temperature conditions: initial temperature of 50° C., held for two minutes at 50° C. after sample injection, heated to 300° C. at a rate of 10° C./min, and held for 10 minutes after reaching 300° C.

<Hardness of Dry Film (Bending Test)>

In accordance with JIS K5600-5-1 (ISO1519), using a cylindrical mandrel bending tester manufactured by BYK-Gardner Gmbh, the hardness of each of the dry films of Examples and Comparative Examples was evaluated based on the minimum mandrel diameter at which cracking of each dry film and detachment from a carrier film started to occur. The evaluation criteria were as follows. When the subject dry film has a good hardness, the resin layer is highly flexible and cracking and powdering thereof can thus be inhibited.

◯: In a φ range of greater than 2 mm and less than 5 mm, neither cracking of the resin layer nor detachment of the carrier film occurred. No powdering of the resin layer occurred. In addition, even at a diameter φ of 2 mm or less, no cracking or powdering of the resin layer occurred, and the carrier film was not detached.

Δ: In a φ range of greater than 2 mm and less than 5 mm, cracking and powdering of the resin layer occurred, and the carrier film was detached.

x: At a diameter φ of 5 mm or greater, cracking and powdering of the resin layer occurred, and the carrier film was detached.

<Residual Air Bubbles>

After removing the protective film, the dry films of Examples and Comparative Examples were each laminated using a batch-type vacuum-pressure laminator MVLP-500 (manufactured by Meiki Co., Ltd.) on a comb-like pattern having a ratio, L (line: wiring width)/S (space: gap width), of 100/100 μm at a copper conductor thickness of 35 μm. Each dry film was heat-laminated under the conditions of 5 kgf/cm$^2$, 180° C., 1 minute and 1 Torr, and subsequently leveled using a hot-plate press at 10 kgf/cm$^2$ and 180° C. for 1 minute. Then, whether or not air was entrapped in the boundary between a line and a space after the lamination and a hole (void) was thereby generated in the resin layer was verified at 20 spots. The evaluation criteria were as follows. When the resin layer is sticky, that is, when the below-described detachability of the carrier film is poor, air bubbles are entrapped between the resin layer and the comb-like pattern and a large number of voids are thus generated. In such a case, cracking is likely to occur.

◯: No void was confirmed.
Δ: Voids were confirmed at 1 to 4 spots.
x: Voids were confirmed at 5 spots or more.

<Detachability of Carrier Film>

After laminating each of the dry films of Examples and Comparative Examples under the same conditions as in the above-described test for residual air bubbles, removing the carrier film, adhesion of a resin composition originating from the resin layer to the carrier film was visually judged. The evaluation criteria were as follows.

◯: No resin composition was adhered to the carrier film.
Δ: A small amount of resin composition was adhered to the carrier film.
x: A large amount of resin composition was adhered to the carrier film.

<Glass Transition Temperature (Tg) and Coefficient of Thermal Expansion (CTE(α1))>

The resin compositions of Examples and Comparative Examples were each laminated in the form of a dry film on the glossy surface side (copper foil) of a GTS-MP foil (manufactured by Furukawa Circuit Foil Co., Ltd.), and the resin layer was cured in a hot air circulation-type drying oven at 180° C. for 60 minutes. Then, after removing the resulting cured article from the copper foil, a sample was cut out at a measurement size (3 mm×10 mm) and measured using TMA6100 manufactured by Seiko Instruments Inc. In this TMA measurement, the sample was heated from room temperature to 250° C. at a rate of 10° C./min, and the glass transition temperature (Tg) and the coefficient of thermal expansion (CTE(α1)) in a range of the Tg or lower were determined.

<Solder Heat Resistance>

Using a batch-type vacuum-pressure laminator MVLP-500 (manufactured by Meiki Co., Ltd.), the dry films of Examples and Comparative Examples were each heat-laminated on copper of a copper-clad laminated plate under the conditions of 5 kgf/cm², 180° C., 1 minute and 1 Torr, and the thus laminated dry film was subsequently leveled using a hot-plate press at 10 kgf/cm² and 180° C. for 1 minute. Then, after removing the carrier film, the resultant was heated in a hot air circulation-type drying oven at 180° C. for 60 minutes to cure the resin layer, thereby obtaining a test substrate. The thus obtained test substrate was immersed in a solder bath at 260° C. for 10 seconds for a total of five times such that the cured coating film of the resin layer came into contact with solder each time, and the test substrate was subsequently cooled to room temperature. The resulting test substrate was observed visually as well as under a light microscope to verify the degree of swelling and detachment of the cured coating film of the resin layer. When a thermoplastic resin is poorly soluble to a solvent, swelling and detachment of the cured coating film occur.

○: Neither swelling nor detachment of the cured coating film of the resin layer was observed.

x: Swelling and detachment of the cured coating film of the resin layer occurred.

<Heating-Cooling Cycle (Inhibition of Cracking)>

Using a batch-type vacuum-pressure laminator MVLP-500 (manufactured by Meiki Co., Ltd.), the dry films of Examples and Comparative Examples (resin thickness: 40 μm) were each laminated on copper of a copper-clad laminated plate under the following conditions: 5 kgf/cm², 120° C., 1 minute and 1 Torr. Then, after removing the carrier film, the resultant was heated in a hot air circulation-type drying oven at 180° C. for 30 minutes to cure the resin layer. Subsequently, using a $CO_2$ laser processing machine (manufactured by Hitachi Via Mechanics, Ltd.), via holes were formed at a top diameter of 65 μm and a bottom diameter of 50 μm.

Next, a treatment with a commercially available wet permanganate desmear solution (manufactured by ATOTECH Gmbh), electroless copper plating (THRU-CUP PEA, manufactured by C. Uemura & Co., Ltd.) and electrolytic copper plating were sequentially performed, thereby subjecting the resin layer to copper plating at a copper thickness of 25 μm such that the via holes were filled. Thereafter, the resultant was cured in a hot air circulation-type drying oven at 190° C. for 60 minutes, thereby obtaining a completely cured and copper-plated test substrate.

The thus obtained test substrate was subjected to thermal history where a single cycle consisted of −65° C. for 30 minutes and 150° C. for 30 minutes. After 2,000 cycles, in order to observe the state of the bottoms and wall surfaces of the via holes under a light microscope, the central part of each via hole was cut using a precision cutter and then polished, and the state of the cut section was observed. Evaluation was performed in accordance with the following criteria. The number of observed via holes was 100.

○: No cracking was observed.

Δ: The occurrence of cracking was 1% to less than 10%.

x: The occurrence of cracking was 10% or higher.

<BHAST Resistance>

On a BT substrate having a comb-shaped electrode (line/space=20 μm/15 μm) formed thereon, each dry film was laminated and heated at 180° C. for 60 minutes to form a cured coating film of the resin layer, thereby preparing an evaluation substrate. This evaluation substrate was placed in a high-temperature high-humidity chamber under an atmosphere having a temperature of 130° C. and a humidity of 85% and charged with a voltage of 5.5 V to perform an in-chamber HAST test for various time periods. The in-chamber insulation resistance values of the cured coating film of the resin layer after various time periods were evaluated based on the following criteria.

◎: After 300 hours, the insulation resistance was not less than $10^8 \Omega$.

○: After 240 hours, the insulation resistance was not less than $10^8 \Omega$.

Δ: After 200 hours, the insulation resistance was not less than $10^8 \Omega$.

x: After 200 hours, the insulation resistance was less than $10^8 \Omega$.

<Solubility of Thermoplastic Resins in Solvents>

The solubility of each thermoplastic resin contained in the dry films of Examples and Comparative Examples in solvents was examined as described below. The evaluation results are shown in Tables 5 to 8.

The solvents used in each of Examples and Comparative Examples were mixed at the same ratio as shown in Tables 1 to 4 to prepare a mixed solvent. The thermoplastic resins used in Examples and Comparative Examples were each dissolved in the mixed solvent as described below.

1) YX6954:

To 30 parts of YX6954, 70 parts of the mixed solvent was added, and the resulting mixture was heat-dissolved with stirring at a temperature lower than the boiling points of the respective components.

2) FX-293:

To 40 parts of FX-293, 60 parts of the mixed solvent was added, and the resulting mixture was heat-dissolved with stirring at a temperature lower than the boiling points of the respective components.

3) KS-1:

To 30 parts of KS-1, 60 parts of the mixed solvent was added, and the resulting mixture was heat-dissolved with stirring at a temperature lower than the boiling points of the respective components.

After heat-dissolving the mixtures of each thermoplastic resin and mixed solvent, the resultants were each cooled to room temperature to prepare a 1 mm-thick film. The thus obtained film was observed under a light microscope at a magnification of ×25 and the presence or absence of solid precipitation was verified in an area of 1 cm×1 cm.

○: Absolutely no coarse particle of 20 μm or larger was observed.

x: One or more coarse particles of 20 μm or larger were observed.

In Examples and Comparative Examples where a plurality of thermoplastic resins were incorporated, solid precipitation was verified for each of the thermoplastic resins in the same manner as described above, and an evaluation "○" was given when absolutely no coarse particle of 20 μm or larger was observed for all of the incorporated thermoplastic resins, while an evaluation "x" was given when one or more coarse particles of 20 μm or larger were observed for at least one of the incorporated thermoplastic resins.

TABLE 5

| | Example | | | | | | | | |
|---|---|---|---|---|---|---|---|---|---|
| | 1 | 2 | 3 | 4 | 5 | 6 | 7 | 8 | 9 |
| Solubility of thermoplastic resin in solvents | ○ | ○ | ○ | ○ | ○ | ○ | ○ | ○ | ○ |
| Drying conditions of dry film  Drying temperature (° C.) | 90 | 90 | 90 | 90 | 90 | 90 | 90 | 90 | 60 |
| Drying time (min) | 10 | 10 | 10 | 10 | 10 | 10 | 10 | 25 | 10 |
| Thickness of dry film after drying (μm) | 40 | 40 | 40 | 40 | 40 | 40 | 40 | 40 | 40 |
| Content of residual organic solvents in dry film (%) | 2.7 | 2.7 | 2.0 | 2.2 | 2.5 | 3.0 | 3.0 | 0.2 | 5.0 |
| Hardness of dry film (Bending test) | ○ | ○ | ○ | ○ | ○ | ○ | ○ | Δ | ○ |
| Residual air bubbles | ○ | ○ | ○ | ○ | ○ | ○ | ○ | ○ | Δ |
| Detachability of carrier film | ○ | ○ | ○ | ○ | ○ | ○ | ○ | ○ | Δ |
| Glass transition temperature (Tg) (° C.) | 170 | 170 | 170 | 170 | 170 | 170 | 170 | 170 | 170 |
| Coefficient of linear expansion (α1) (ppm) | 17 | 17 | 17 | 17 | 17 | 17 | 17 | 17 | 17 |
| Solder heat resistance | ○ | ○ | ○ | ○ | ○ | ○ | ○ | ○ | ○ |
| Heating-cooling cycle | ○ | ○ | ○ | ○ | ○ | ○ | ○ | ○ | ○ |
| BHAST resistance | ○ | ○ | ○ | ○ | ○ | ○ | ◎ | ○ | Δ |

TABLE 6

| | Example | | | | | | | | |
|---|---|---|---|---|---|---|---|---|---|
| | 10 | 11 | 12 | 13 | 14 | 15 | 16 | 17 | 18 |
| Solubility of thermoplastic resin in solvents | ○ | ○ | ○ | ○ | ○ | ○ | ○ | ○ | ○ |
| Drying conditions of dry film  Drying temperature (° C.) | 90 | 90 | 90 | 90 | 90 | 90 | 90 | 90 | 90 |
| Drying time (min) | 10 | 10 | 10 | 10 | 10 | 10 | 10 | 10 | 10 |
| Thickness of dry film after drying (μm) | 40 | 40 | 40 | 40 | 40 | 40 | 40 | 40 | 40 |
| Content of residual organic solvents in dry film (%) | 2.7 | 2.7 | 2.7 | 2.0 | 2.0 | 2.0 | 2.7 | 2.0 | 2.0 |
| Hardness of dry film (Bending test) | ○ | ○ | Δ | ○ | ○ | ○ | ○ | ○ | ○ |
| Residual air bubbles | ○ | ○ | ○ | ○ | ○ | ○ | ○ | ○ | ○ |
| Detachability of carrier film | ○ | ○ | ○ | ○ | ○ | ○ | ○ | ○ | ○ |
| Glass transition temperature (Tg) (° C.) | 170 | 170 | 170 | 154 | 156 | 156 | 170 | 156 | 154 |
| Coefficient of linear expansion (α1) (ppm) | 55 | 40 | 15 | 23 | 35 | 46 | 30 | 23 | 31 |
| Solder heat resistance | ○ | ○ | ○ | ○ | ○ | ○ | ○ | ○ | ○ |
| Heating-cooling cycle | Δ | ○ | ○ | Δ | Δ | Δ | Δ | Δ | Δ |
| BHAST resistance | ○ | ○ | ○ | ○ | ○ | ○ | ○ | ○ | ○ |

TABLE 7

| | Example 19 |
|---|---|
| Solubility of thermoplastic resin in solvents | ○ |
| Drying conditions of dry film  Drying temperature (° C.) | 90 |
| Drying time (min) | 10 |
| Thickness of dry film after drying (μm) | 40 |
| Content of residual organic solvents in dry film (%) | 2.8 |
| Hardness of dry film (Bending test) | ○ |
| Residual air bubbles | ○ |
| Detachability of carrier film | ○ |
| Glass transition temperature (Tg) (° C.) | 173 |
| Coefficient of linear expansion (α1) (ppm) | 17 |
| Solder heat resistance | ○ |
| Heating-cooling cycle | ○ |
| BHAST resistance | ○ |

TABLE 8

| | Comparative Example | | |
|---|---|---|---|
| | 1 | 2 | 3 |
| Solubility of thermoplastic resin in solvents | ○ | x | ○ |
| Drying conditions of dry film  Drying temperature (° C.) | 90 | 90 | 90 |
| Drying time (min) | 10 | 10 | 10 |
| Thickness of dry film after drying (μm) | 40 | 40 | 40 |
| Content of residual organic solvents in dry film (%) | 7.0 | <0.01 | 6.5 |
| Hardness of dry film (Bending test) | ○ | x | ○ |
| Residual air bubbles | x | ○ | x |
| Detachability of carrier film | x | ○ | x |
| Glass transition temperature (Tg) (° C.) | 170 | 170 | 170 |
| Coefficient of linear expansion (α1) (ppm) | 17 | 17 | 17 |

TABLE 8-continued

|  | Comparative Example | | |
|---|---|---|---|
|  | 1 | 2 | 3 |
| Solder heat resistance | not measurable*[39] | x | not measurable*[39] |
| Heating-cooling cycle | not measurable*[39] | x | not measurable*[39] |
| BHAST resistance | not measurable*[39] | x | not measurable*[39] |

*[39]The property could not be tested because a large amount of a resin originated from the resin layer adhered to the carrier film when the carrier film was detached after lamination.

From the results shown in Tables 5 to 8, it is seen that a resin layer which has excellent detachability from the carrier film and in which cracking and powdering are inhibited can be obtained in the dry films of Examples 1 to 19.

On the other hand, in the dry film of Comparative Example 1 in which two or more solvents were incorporated but only one of them had a boiling point of 100° C. or higher and the dry film of Comparative Example 3 in which two solvents having a boiling point of 100° C. or higher were incorporated but their boiling points were substantially the same, since the detachability from the carrier film was poor and a large amount of the resin layer was also detached when the carrier film was detached, it is seen that these dry films are not acceptable in practice. In addition, since the resin layers of the dry films of Comparative Examples 1 and 3 were sticky, residual air bubbles were generated when the dry films were each laminated on the substrate.

In the dry film of Comparative Example 2 which contained only a solvent having a boiling point of lower than 100° C., although the detachability from the carrier film was excellent, the resin layer was not flexible, so that cracking and powdering occurred. Further, the cured coating film of the resin layer obtained from the dry film of Comparative Example 2 was poor in terms of solder heat resistance, resistance to heating-cooling cycle and insulating property.

DESCRIPTION OF SYMBOLS

1: Insulating substrate
3: Inner conductor pattern
3a: Connection part
4, 9: Resin insulating layer
8: Outer conductor pattern
10: Outermost conductor pattern
20: Through-hole
21: Through-hole via
22: Connection part
30a: Test tube for liquid assessment
30b: Test tube for temperature measurement
31: Marked line (line A)
32: Marked line (line B)
33a, 33b: Rubber stopper
34: Thermometer
X: Laminated substrate

The invention claimed is:

1. A dry film, comprising:
a resin layer comprising a thermosetting resin component, a filler and a plurality of solvents,
wherein the solvents each have a boiling point of 100° C. or higher, the solvents have boiling points which are different by not less than 5° C., and the solvents are ones selected from the group consisting of toluene, cyclohexanone, and an aromatic hydrocarbon having 8 or more carbon atoms.

2. The dry film according to claim 1, wherein the solvents comprise toluene and cyclohexanone.

3. The dry film according to claim 1, wherein the filler is included in an amount of 30 to 80% by weight based on a total amount of the dry film excluding the solvents.

4. The dry film according to claim 1, wherein the thermosetting resin component comprises an epoxy compound, and the resin layer further includes a curing agent.

5. A printed wiring board, comprising:
a cured article obtained by a process including curing the resin layer of the dry film according to claim 1.

6. A printed wiring board, comprising:
a cured article obtained by a process including curing the resin layer of the dry film according to claim 2.

7. A printed wiring board, comprising:
a cured article obtained by a process including curing the resin layer of the dry film according to claim 3.

8. A printed wiring board, comprising:
a cured article obtained by a process including curing the resin layer of the dry film according to claim 4.

9. The dry film according to claim 1, wherein the resin layer includes the solvents in an amount of 0.1 to 4% by weight based on a total amount of the resin layer of the dry film including the solvents.

10. The dry film according to claim 1, wherein the resin layer includes the solvents in an amount of 0.3 to 3% by weight based on a total amount of the resin layer of the dry film including the solvents.

11. The dry film according to claim 2, wherein the resin layer includes the solvents in an amount of 0.1 to 4% by weight based on a total amount of the resin layer of the dry film including the solvents.

12. The dry film according to claim 2, wherein the resin layer includes the solvents in an amount of 0.3 to 3% by weight based on a total amount of the resin layer of the dry film including the solvents.

13. The dry film according to claim 3, wherein the resin layer includes the solvents in an amount of 0.1 to 4% by weight based on a total amount of the resin layer of the dry film including the solvents.

14. The dry film according to claim 3, wherein the resin layer includes the solvents in an amount of 0.3 to 3% by weight based on a total amount of the resin layer of the dry film including the solvents.

15. The dry film according to claim 4, wherein the resin layer includes the solvents in an amount of 0.1 to 4% by weight based on a total amount of the resin layer of the dry film including the solvents.

16. The dry film according to claim 4, wherein the resin layer includes the solvents in an amount of 0.3 to 3% by weight based on a total amount of the resin layer of the dry film including the solvents.

17. The dry film according to claim 4, wherein the epoxy compound comprises at least one solid epoxy resin.

18. The dry film according to claim 4, wherein the epoxy compound comprises at least one of a solid epoxy resin and a semi-solid epoxy resin.

19. The dry film according to claim 4, wherein the epoxy compound comprises at least one solid epoxy resin and at least one semi-solid epoxy resin.

* * * * *